(12) United States Patent
Liang et al.

(10) Patent No.: US 10,985,547 B2
(45) Date of Patent: Apr. 20, 2021

(54) CURRENT DIFFERENTIAL PROTECTION METHOD FOR SELF-ADAPTIVE HALF-WAVELENGTH LINE BASED ON TIME-DIFFERENCE METHOD

(71) Applicants: CHINA ELECTRIC POWER RESEARCH INSTITUTE COMPANY LIMITED, Beijing (CN); STATE GRID CORPORATION OF CHINA, Beijing (CN); CENTRAL CHINA BRANCH OF STATE GRID CORPORATION OF CHINA, Wuhan (CN)

(72) Inventors: Xuming Liang, Beijing (CN); Yarong Guo, Beijing (CN); Huanzhang Liu, Wuhan (CN); Xiao Li, Beijing (CN); Zexin Zhou, Beijing (CN); Dingxiang Du, Beijing (CN); Delin Wang, Beijing (CN); Jing Li, Beijing (CN); Huixin Li, Wuhan (CN); Zhongqing Li, Beijing (CN)

(73) Assignees: CHINA ELECTRIC POWER RESEARCH INSTITUTE COMPANY LIMITED, Beijing (CN); STATE GRID CORPORATION OF CHINA, Beijing (CN); CENTRAL CHINA BRANCH OF STATE GRID CORPORATION OF CHINA, Hubei (CN)

( * ) Notice: Subject to any disclaimer, the term of this patent is extended or adjusted under 35 U.S.C. 154(b) by 273 days.

(21) Appl. No.: 16/062,515

(22) PCT Filed: Jul. 11, 2016

(86) PCT No.: PCT/CN2016/089672
§ 371 (c)(1),
(2) Date: Jun. 14, 2018

(87) PCT Pub. No.: WO2017/128631
PCT Pub. Date: Aug. 3, 2017

(65) Prior Publication Data
US 2018/0375322 A1    Dec. 27, 2018

(30) Foreign Application Priority Data
Jan. 29, 2016    (CN) .......................... 201610066743.8

(51) Int. Cl.
*H02H 3/04*      (2006.01)
*H02H 3/30*      (2006.01)

(52) U.S. Cl.
CPC ............ *H02H 3/042* (2013.01); *H02H 3/305* (2013.01)

(58) Field of Classification Search
CPC .......................... G01R 31/085; H02H 3/26–34
See application file for complete search history.

(56) References Cited

U.S. PATENT DOCUMENTS 10,605,852 B2 *   3/2020   Du .......................... H02H 7/26
2015/0226781 A1   8/2015   Sun et al.

FOREIGN PATENT DOCUMENTS

CN       1858954 A      11/2006
CN     102324722 A       1/2012
(Continued)

OTHER PUBLICATIONS

S. Xiao, Y. Cheng, W. Wan and Y. Wang, "Relay protection for half wavelength AC transmission line," 2011 International Conference on Advanced Power System Automation and Protection, Beijing, 2011, pp. 1308-1311, (Year: 2011).*

(Continued)

*Primary Examiner* — Peter M Novak
(74) *Attorney, Agent, or Firm* — Arent Fox LLP; Michael Fainberg

(57) ABSTRACT

A current differential protection method for a self-adaptive half-wavelength line based on a time-difference method. Since an electrical distance of half-wavelength power transmission is long, after a fault occurs, there is an obvious time difference between the actuation times for protecting starting elements at two sides of a line. According to the principles of wave propagation, the position of a fault point can be determined by means of a difference between the actuation (Continued)

times for protecting the starting elements at the two sides of the line. By means of taking the fault point as a differential point, a current value at the differential point can be obtained according to a long line equation by means of the voltage and current at protection-mounted positions at the two sides of the line, and a differential current is then calculated.

8 Claims, 2 Drawing Sheets

(56) References Cited

FOREIGN PATENT DOCUMENTS

| CN | 102324772 A | 1/2012 |
|----|-------------|--------|
| CN | 102403699 A | 4/2012 |
| CN | 102856890 A | 1/2013 |
| CN | 102868150 A | 1/2013 |
| CN | 103176103 A | 6/2013 |
| CN | 105576623 A | 5/2016 |
| JP | H06-289067 A | 10/1994 |

OTHER PUBLICATIONS

Z. Y. Xu, Z. Q. Du, L. Ran, Y. K. Wu, Q. X. Yang and J. L. He, "A Current Differential Relay for a 1000-kV UHV Transmission Line," in IEEE Transactions on Power Delivery, vol. 22, No. 3, pp. 1392-1399, Jul. 2007, (Year: 2007).*

English Translation of the Written Opinion of the International Search Authority in international application No. PCT/CN2016/089672, dated Oct. 19, 2016.

International Search Report issued in International Application No. PCT/CN2016/089672, dated Oct. 19, 2016 (4 pages).

* cited by examiner

CURRENT DIFFERENTIAL PROTECTION METHOD FOR SELF-ADAPTIVE HALF-WAVELENGTH LINE BASED ON TIME-DIFFERENCE METHOD

CROSS-REFERENCE TO RELATED APPLICATIONS

The present application is the U.S. National Stage Application of International Patent Application No. PCT/CN2016/089672, filed on Jul. 11, 2016, which claims benefit of Chinese Patent Application No. 201610066743.8, filed on Jan. 29, 2016. The contents of each of these applications the application are hereby incorporated by reference in their its entirety.

TECHNICAL FIELD

The disclosure relates to the field of relay protection, and particularly to a self-adaptive current differential protection method for a half wavelength line based on a time difference method, and a storage medium.

BACKGROUND

Half Wavelength Alternating Current (AC) Transmission (HWACT) refers to ultralong-distance three-phase AC transmission of which an electrical distance for transmission is approximate to a power frequency (industrial AC frequency) half wave, i.e. 3,000 km (corresponding to 50 hertz AC frequency) or 2,600 km (corresponding to 60 hertz AC frequency).

Compared with medium-length (hundreds of kilometers) AC transmission, such ultralong-distance AC transmission has some distinct characteristics and remarkable advantages. For example, no reactive power compensation equipment is required to be mounted; no intermediate switching station is required to be arranged; and overvoltage level is not high.

As main protection for a medium-length AC transmission line, current differential protection is widely applied. However, current differential protection requires compensation of capacitive current. There is an inevitable difference in voltage at each position along the half wavelength line, and the difference in the voltage at each position cannot be ignored. For the difference in the voltage across the power line, the traditional capacitive current compensation method is no longer applicable. Until now, there is no effective solution for how to effectively solve the problem that the conventional differential current protection cannot be applied to half-wavelength lines.

SUMMARY

Embodiments of the disclosure are intended to provide a self-adaptive current differential protection method for a half wavelength line based on a time difference method and a storage medium. A location of a fault point is calculated according to the time difference method, the fault point is regarded as a differential point, currents at the differential point are calculated by virtue of currents on both sides of the line, and a braking coefficient and threshold value for current differential protection are adaptively changed according to different positions of the differential point, so as to form a current differential protection method to achieve sensitivity of current differential protection over the whole line.

In order to achieve the purpose, the embodiments of the disclosure provide the following technical solutions.

According to a first aspect, a self-adaptive current differential protection method for a half wavelength line based on a time difference method is provided, including:

a fault point in the half wavelength line is determined according to the time difference method;

the fault point is regarded as a differential point, and currents at the differential point are determined according to a long line equation;

a braking coefficient and a threshold value are adaptively changed according to position of the differential point; and whether to perform a current differential protection on the differential point is determined on the basis of the currents at the differential point and the adaptively changed braking coefficient and threshold value.

In the solution, the operation that the fault point is determined according to the time difference method includes that: action time $T_M$ and $T_N$ of protection starting elements on both sides of the half wavelength line is determined according to the time difference method, thereby determining a position of the fault point.

A criterion of the protection starting elements according to the time difference method is shown in the following formula (1):

$$\begin{cases} \Delta f(t) = \Delta i_A^2(t) + \Delta i_B^2(t) + \Delta i_C^2(t) \\ |d\Delta f(t)| > f_{set} = (0.07 \text{ kA})^2 = 0.005 \text{ kA}^2 \end{cases} \quad (1)$$

in the formula, $\Delta i_A(t)=i_A(t)-i_A(t-T)$, $\Delta i_B(t)=i_B(t)-i_B(t-T)$, and $\Delta i_C(t)=i_C(t)-i_C(t-T)$, $i_A(t)$, $i_B(t)$ and $i_C(t)$ being current sampling values of three phases A, B and C with relay protection devices of the half wavelength line, respectively, $\Delta i_A(t)$, $\Delta i_B(t)$ and $\Delta i_C(t)$ being mutations of the current sampling values of three phases A, B and C, T being a power frequency period, $\Delta f(t)$ being a quadratic sum function of the current mutations, $f_{set}$ being a setting current value, d in $|d\Delta f(t)|$ being a difference operator, and when $|d\Delta f(t)|$ is larger than the setting current value $f_{set}$, a protection starting criterion is met, the formula (1) is met and the protection starting elements start to act.

The action time of the protection starting elements in the protection devices mounted on both sides of the half wavelength line is $T_M$ and $T_N$ respectively.

The location of the fault point of the half wavelength line is calculated according to the following formula:

$$L_{FM} = ((T_M - T_N)v_{light} + L)/2 \quad (2)$$

in the formula, $L_{FM}$ being a distance from the fault point to a side M of the line, L being a length 3,000 km of the half wavelength line and $v_{light}$ being a propagation velocity of light.

In Step 2), the fault point $L_{FM}$ is regarded as the differential point, and the currents at the differential point are obtained according to the long line equation.

The currents at the differential point are determined according to the following formula:

$$\begin{cases} I_{x-} = I_M \cosh(\gamma x) - \dfrac{U_M}{Z_c} \sinh(\gamma x) \\ I_{x+} = I_N \cosh(\gamma (L-x)) - \dfrac{U_N}{Z_c} \sinh(\gamma (L-x)) \end{cases} \quad (3)$$

in the formula, $x=L_{FM}$, $I_{N+}$ and $I_{N-}$ being the currents at the differential point, $U_M$, $U_N$, $I_M$ and $I_N$ being phasor values of voltages and currents on the side M and side N of the line respectively, $Z_c$ being wave impedance of the line and $\gamma$ being a propagation constant of the line.

In the above solution, the braking coefficient and the threshold value are adaptively changed according to the position of the differential point, including: the braking coefficient k and a differential current threshold value $I_{set}$ are adaptively changed according to the following formulae (4) and (5):

$$k = \begin{cases} -0.8L_{FM}/1000 + 0.8 & L_{FM} < 1000 \text{ km} \\ 0 & 1000 \text{ km} \leq L_{FM} \leq 2000 \text{ km} \\ 0.8L_{FM}/1000 - 1.6 & L_{FM} < 3000 \text{ km} \end{cases} \quad (4)$$

$$I_{set} = \begin{cases} -0.5L_{FM}/1000 + 0.8 & L_{FM} < 1000 \text{ km} \\ 0.3 & 1000 \text{ km} \leq L_{FM} \leq 2000 \text{ km} \\ 0.5L_{FM}/1000 - 0.7 & L_{FM} < 3000 \text{ km} \end{cases} \quad (5)$$

In the solution, the operation that whether to perform the current differential protection on the differential point is determined on the basis of the currents at the differential point and the adaptively changed braking coefficient and threshold value includes that: whether to perform the current differential protection or not is judged according to the following formula (6):

$$\begin{cases} |I_{x-} + I_{x+}| \geq k|I_{x-} - I_{x+}| \\ |I_{x-} + I_{x+}| \geq I_{set} \end{cases} \quad (6)$$

if a criterion of the current differential protection shown in the formula (6) is met, the current differential protection is performed.

According to a second aspect, the embodiments of the disclosure provides a storage medium, in which an executable instruction is stored, the executable instruction being configured to execute the self-adaptive current differential protection method for the half wavelength line based on the time difference method provided by the embodiments of the disclosure.

The technical solutions provided by the embodiments of the disclosure have the following beneficial effects.

The self-adaptive current differential protection method for the half wavelength line based on the time difference method is used to solve the problem that a conventional method for compensating the capacitive current is inapplicable because of an electrical distance for half wavelength transmission is long and differences between voltages at each position along the line cannot be ignored. According to the principle of wave propagation, the location of the fault point can be determined by the time difference between the activation of the protection elements on both sides. Using the fault point as the differential point, the current value at the differential point can be obtained by using the long-line equation, and then the differential current can be calculated. The criterion of the current differential protection has different sensitivities in case of faults occur at different locations of the half wavelength line, thus the braking coefficient and threshold value for current differential protection are adaptively changed according to the location of the differential point. The current differential protection is formed on the basis of the currents at the differential point and the adaptively changed braking coefficient and threshold value, so that it is ensured that the current differential protection is sensitive to the whole line, and reduces the loss and inconvenience brought by a fault in the half wavelength line.

DETAILED DESCRIPTION

Figure 1:
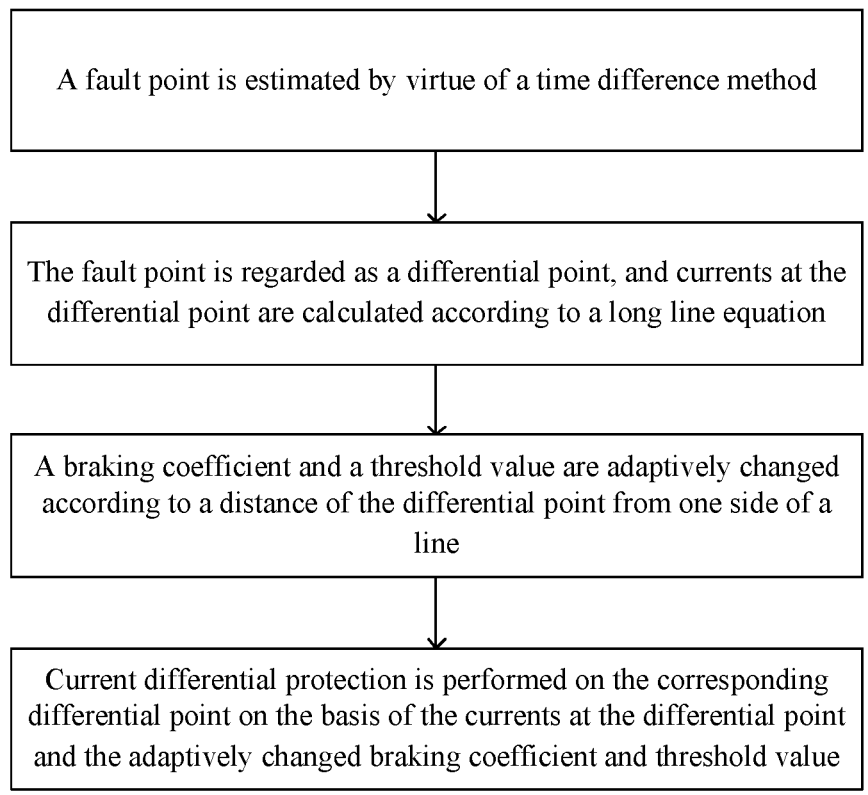
FIG. 1 is a flowchart of a current differential protection method for a half wavelength line according to an embodiment of the disclosure.
Figure 2:
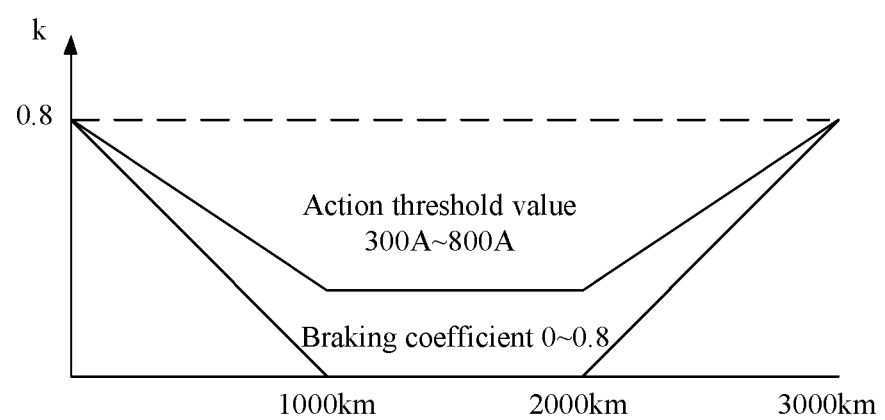
FIG. 2 is a schematic diagram of adaptively changing a braking coefficient and threshold value for the current differential protection according to an embodiment of the disclosure.

The disclosure will be further described below in combination with the drawings and embodiments in detail. It should be understood that the embodiments provided herein are only adopted to explain the disclosure and not intended to limit the disclosure. In addition, the embodiments provided below are adopted not to provide all embodiments of the disclosure but to implement part of embodiments of the disclosure. The technical solutions recorded in the embodiments of the disclosure may be implemented in any combination thereof without conflict.

Before the disclosure is further described in detail, nouns and terms involved in the embodiments of the disclosure will be described, and the nouns and terms involved in the embodiments of the disclosure are applied to the following explanations.

1) HWACT refers to ultralong-distance three-phase AC transmission of which an electrical distance is approximate to a power frequency half wave, i.e. 3,000 km (50 Hz) or 2,600 km (60 Hz).

2) A protection starting element (also called as a relay protection starting element) is configured to start current differential protection elements in relay protection devices mounted on both sides of a half wavelength line, and action of the protection starting element indicates the start of a fault in the half wavelength line.

3) The current differential protection element is a protection element calculating a differential current according to the currents on both sides of the half wavelength line and acting for protection when the differential current reaches a set action value.

4) The relay protection device is an automatic measure and equipment capable of timely sending an alarming signal to a duty officer or directly sending a tripping command to a controlled circuit breaker to stop development of these events when the failure of electric equipment (such as a generator and a line) in a power system or the power system itself endangers safe operation of the power system. A complete set of equipment implementing this automatic measure is collectively called as a relay protection device under a normal circumstance.

The relay protection device is formed of a measurement part, a logic part and an execution part.

The measurement part acquires sampling values of the currents and voltages on both sides of the line.

According to magnitudes, properties, logic states of output quantities of the measurement part, sequence of appearance or their combination, the logic part enables the relay protection device to work (determining whether a criterion for the protection starting element and a criterion for the current differential protection element are true or not) according to a certain logic relationship, and finally determines whether to execute tripping or send the signal, and transmits the related command to the execution part.

The execution part finally completes a task of the relay protection device according the signal transmitted by the logic part.

Taking a microcomputer relay protection device as an example, it is formed of highly integrated built-in bus single-chip microcomputer, a high-accuracy current and voltage transformer, a high-insulating-intensity exit intermediate relay, a high-reliability switching power module and the like.

5) A braking coefficient is a ratio of operating current to braking current. When the relay protection device implements current differential protection, a sum of current phasor on both sides of the half wavelength line is the operating current (also called the differential current), a difference between the current phasor on both sides is the braking current, a product of the braking coefficient and the braking current is a braking amount, and protection action starts when the action current is higher than the braking amount.

6) A threshold value: the threshold value is a starting current of the current differential protection element, and when the action current is higher than the threshold value, the current differential protection element is started, and a protection judgment is made.

7) A setting current refers to a maximum current that can pass through a heating element for a long time without causing the differential relay protection device to act. A value of the setting current is specified based on bearing capabilities of the half wavelength transmission line and a power grid.

An embodiment provides a self-adaptive differential protection method for a half wavelength line based on a time difference method. Exemplarily, steps of the method are shown in FIG. 1.

(1) Determine the action time of protection starting elements.

The action time of the protection starting elements is a time when the protection starting elements detect a fault, and the action time of the protection starting elements on both sides of the half-wavelength line are set to $T_M$ and $T_N$.

Here, the both sides refer to relay protection devices on both sides relative to a spatial range of the half wavelength line, and the relay protection devices are mounted on both sides of the half wavelength line respectively.

A criterion of judging the protection starting elements on the basis of a time difference method is shown in a formula (1):

$$\begin{cases} \Delta f(t) = \Delta i_A^2(t) + \Delta i_B^2(t) + \Delta i_C^2(t) \\ |d\Delta f(t)| > f_{set} = (0.07 \text{ kA})^2 = 0.005 \text{ kA}^2 \end{cases} \quad (1)$$

where $\Delta i_A(t)=i_A(t)-i_A(t-T)$, $\Delta i_B(t)=i_B(t)-i_B(t-T)$, and $\Delta i_C(t)=i_C(t)-i_C(t-T)$, $i_A(t)$, $i_B(t)$ and $i_C(t)$ are current sampling values of three phases A, B and C with relay protection devices of the half wavelength line, respectively, $\Delta i_A(t)$, $\Delta i_B(t)$ and $\Delta i_C(t)$ are mutations of the current sampling values of three phases A, B and C, T is a power frequency period, $\Delta f(t)$ is a quadratic sum function of the current mutations, $f_{set}$ is a setting current value, d in $|d\Delta f(t)|$ is a difference operator, and when $|d\Delta f(t)|$ is larger than the setting current value $f_{set}$, a protection starting criterion (i.e. a condition under which the protection starting elements act) is met.

(2) A location of a fault point is determined by virtue of the time difference method, and is represented by a distance $L_{FM}$ of the fault point from a side M of the half wavelength line, $L_{FM}$ being shown as follows:

$$L_{FM}=((T_M-T_N)v_{light}+L)/2 \quad (2)$$

where $v_{light}$ is a light velocity, and L is a length of the half wavelength line.

(3) The fault point $L_{FM}$ is regarded as a differential point, and currents $I_{x+}$ and $I_{x-}$ at the differential point are obtained by virtue of a long line equation:

$$\begin{cases} I_{x-} = I_M \cosh(\gamma x) - \dfrac{U_M}{Z_c} \sinh(\gamma x) \\ I_{x+} = I_N \cosh(\gamma(L-x)) - \dfrac{U_N}{Z_c} \sinh(\gamma(L-x)) \end{cases} \quad (3)$$

(4) A braking coefficient and threshold value in a criterion for current differential protection are adaptively determined as follows:

$$k = \begin{cases} -0.8L_{FM}/1000 + 0.8 & L_{FM} < 1000 \text{ km} \\ 0 & 1000 \text{ km} \leq L_{FM} \leq 2000 \text{ km} \\ 0.8L_{FM}/1000 - 1.6 & L_{FM} < 3000 \text{ km} \end{cases} \quad (4)$$

and $$I_{set} = \begin{cases} -0.5L_{FM}/1000 + 0.8 & L_{FM} < 1000 \text{ km} \\ 0.3 & 1000 \text{ km} \leq L_{FM} \leq 2000 \text{ km} \\ 0.5L_{FM}/1000 - 0.7 & L_{FM} < 3000 \text{ km} \end{cases} \quad (5)$$

(5) Whether to perform a current differential protection on the differential point is determined on the basis of $I_{x+}$, $I_{x-}$ and the adaptively changed braking coefficient and threshold value, the criterion of the current differential protection is:

$$\begin{cases} |I_{x-} + I_{x+}| \geq k|I_{x-} - I_{x+}| \\ |I_{x-} + I_{x+}| \geq I_{set} \end{cases}, \quad (6)$$

and if the criterion of the current differential protection shown in the formula (6) is met, current differential protection is performed.

Finally, it should be noted that: the above embodiments are merely intended for describing the technical solutions of the disclosure rather than limiting it. Those skilled in the art, although referring to the above embodiments, should know that modifications or equivalent replacements may still be made to specific implementation modes of the disclosure, and any modifications or equivalent replacements made without departing from the spirit and scope of the disclosure shall fall within the scope of protection of the claims of the disclosure applying for approval.

The invention claimed is:

1. A self-adaptive current differential protection method for a half wavelength line based on a time difference method, comprising:
  determining, by a relay protection device, a location of a fault point according to action time $T_M$ and $T_N$ of protection starting elements on both sides of the half wavelength line;

regarding the fault point as a differential point, and determining, by the relay protection device, currents at the differential point according to a long line equation;

adaptively changing, by the relay protection device, a braking coefficient and a threshold value according to location of the differential point; and determining, by the relay protection device, whether to perform a current differential protection on the differential point on the basis of the currents at the differential point and the adaptively changed braking coefficient and threshold value;

wherein determining the location of the fault point according to the action time $T_M$ and $T_N$ of the protection starting elements on both sides of the half wavelength line comprises:

determining a distance of the fault point from a side M of the half wavelength line according to the following formula:

$$L_{FM}=((T_M-T_N)v_{light}+L)/2,$$

in the formula, $L_{FM}$ being the distance of the fault point from the side M of the half wavelength line, L being a length of the half wavelength line and $v_{light}$ being a propagation velocity of light; and adaptively changing the braking coefficient and the threshold value according to the location of the differential point comprises:

adaptively changing the braking coefficient k and a differential current threshold value $I_{set}$ according to the following formulae:

$$k = \begin{cases} -0.8L_{FM}/1000+0.8 & L_{FM} < 1000 \text{ km} \\ 0 & 1000 \text{ km} \leq L_{FM} \leq 2000 \text{ km} \\ 0.8L_{FM}/1000-1.6 & L_{FM} < 3000 \text{ km} \end{cases}$$

and $$I_{set} = \begin{cases} -0.5L_{FM}/1000+0.8 & L_{FM} < 1000 \text{ km} \\ 0.3 & 1000 \text{ km} \leq L_{FM} \leq 2000 \text{ km} \\ 0.5L_{FM}/1000-0.7 & L_{FM} < 3000 \text{ km} \end{cases}.$$

2. The method according to claim 1, wherein actions of the protection starting elements meet the following criterion:

$$\begin{cases} \Delta f(t) = \Delta i_A^2(t) + \Delta i_B^2(t) + \Delta i_C^2(t) \\ |d\Delta f(t)| > f_{set} = (0.07 \text{ kA})^2 = 0.005 \text{ kA}^2 \end{cases},$$

where $\Delta i_A(t)=i_A(t)-i_A(t-T)$, $\Delta i_B(t)=i_B(t)-i_B(t-T)$, and $\Delta i_C(t)=i_C(t)-i_C(t-T)$, $i_A(t)$, $i_B(t)$ and $i_C(t)$ are current sampling values of three phases A, B and C with relay protection devices of the half wavelength line, respectively, $\Delta i_A(t)$, $\Delta i_B(t)$ and $\Delta i_c(t)$ are mutations of the current sampling values of three phases A, B and C, T is a power frequency period, $\Delta f(t)$ is a quadratic sum function of the current mutations, $f_{set}$ is a setting current value, d in $|d\Delta f(t)|$ is a difference operator, and when $|d\Delta f(t)|$ is larger than the setting current value $f_{set}$, a protection starting criterion is met.

3. The method according to claim 1, wherein determining the currents at the differential point according to the long line equation comprises:

determining the currents at the differential point according to the following long line equation:

$$\begin{cases} I_{x-} = I_M \cosh(\gamma x) - \dfrac{U_M}{Z_c}\sinh(\gamma x) \\ I_{x+} = I_N \cosh(\gamma(L-x)) - \dfrac{U_N}{Z_c}\sinh(\gamma(L-x)) \end{cases},$$

in the formula, $x=L_{FM}$, $I_{x+}$ and $I_{x-}$ being the currents at the differential point, $U_M$ and $I_M$ being phasor values of a voltage and current on the side M of the half wavelength line respectively, $U_N$ and $I_N$, being phasor values of a voltage and current on a side N of the half wavelength line respectively, $Z_c$ being wave impedance of the half wavelength line and $\gamma$ being a propagation constant of the half wavelength line.

4. The method according to claim 1, wherein determining whether to perform the current differential protection on the differential point on the basis of the currents at the differential point and the adaptively changed braking coefficient and threshold value comprises:

forming following criterion for the current differential protection to determine whether to perform the current differential protection on the differential point on the basis of the currents at the differential point and the adaptively changed braking coefficient and threshold value:

$$\begin{cases} |I_{x-}+I_{x+}| \geq k|I_{x-}-I_{x+}| \\ |I_{x-}+I_{x+}| \geq I_{set} \end{cases},$$

and if such criterion for the current differential protection is met, performing the current differential protection.

5. A non-transitory computer storage medium stored therein instructions that, when executed by a processor, cause the processor to execute a self-adaptive current differential protection method for a half wavelength line based on a time difference method, the method comprising:

determining a location of a fault point according to action time $T_M$ and $T_N$ of protection starting elements on both sides of the half wavelength line;

regarding the fault point as a differential point, and determining currents at the differential point according to a long line equation;

adaptively changing a braking coefficient and a threshold value according to location of the differential point; and determining whether to perform a current differential protection on the differential point on the basis of the currents at the differential point and the adaptively changed braking coefficient and threshold value;

wherein determining the location of the fault point according to the action time $T_M$ and $T_N$ of the protection starting elements on both sides of the half wavelength line comprises:

determining a distance of the fault point from a side M of the half wavelength line according to the following formula:

$$L_{FM}=((T_M-T_N)v_{light}+L)/2$$

in the formula, $L_{FM}$ being the distance of the fault point from the side M of the half wavelength line, L being a length of the half wavelength line and $v_{light}$ being a propagation velocity of light; and adaptively changing the braking coefficient and the threshold value according to location of the differential point comprises:
adaptively changing the braking coefficient k and a differential current threshold value $I_{set}$ according to the following formulae:

$$k = \begin{cases} -0.8L_{FM}/1000 + 0.8 & L_{FM} < 1000 \text{ km} \\ 0 & 1000 \text{ km} \leq L_{FM} \leq 2000 \text{ km} \\ 0.8L_{FM}/1000 - 1.6 & L_{FM} < 3000 \text{ km} \end{cases}$$

and $$I_{set} = \begin{cases} -0.5L_{FM}/1000 + 0.8 & L_{FM} < 1000 \text{ km} \\ 0.3 & 1000 \text{ km} \leq L_{FM} \leq 2000 \text{ km} \\ 0.5L_{FM}/1000 - 0.7 & L_{FM} < 3000 \text{ km} \end{cases}.$$

6. The non-transitory computer storage medium according to claim 5, wherein actions of the protection starting elements meet the following criterion:

$$\begin{cases} \Delta f(t) = \Delta i_A^2(t) + \Delta i_B^2(t) + \Delta i_C^2(t) \\ |d\Delta f(t)| > f_{set} = (0.07 \text{ kA})^2 = 0.005 \text{ kA}^2 \end{cases},$$

where $\Delta i_A(t) = i_A(t) - i_A(t-T)$, $\Delta i_B(t) = i_B(t) - i_B(t-T)$, and $\Delta i_C(t) = i_C(t) - i_C(t-T)$, $i_A(t)$, $i_B(t)$ and $i_C(t)$ are current sampling values of three phases A, B and C with relay protection devices of the half wavelength line, respectively, $\Delta i_A(t)$, $\Delta i_B(t)$ and $\Delta i_C(t)$ are mutations of the current sampling values of three phases A, B and C, T is a power frequency period, $\Delta f(t)$ is a quadratic sum function of the current mutations, $f_{set}$ is a setting current value, d in $|d\Delta f(t)|$ is a difference operator, and when $|d\Delta f(t)|$ is larger than the setting current value $f_{set}$, a protection starting criterion is met.

7. The non-transitory computer storage medium according to claim 5, wherein determining the currents at the differential point according to the long line equation comprises:

determining the currents at the differential point according to the following long line equation:

$$\begin{cases} I_{x-} = I_M \cosh(\gamma x) - \dfrac{U_M}{Z_c} \sinh(\gamma x) \\ I_{x+} = I_N \cosh(\gamma(L-x)) - \dfrac{U_N}{Z_c} \sinh(\gamma(L-x)) \end{cases},$$

in the formula, $x = L_{FM}$, $I_{x+}$ and $I_{x-}$ being the currents at the differential point, $U_M$ and $I_M$ being phasor values of a voltage and current on the side M of the half wavelength line respectively, $U_N$ and $I_N$ being phasor values of a voltage and current on a side N of the half wavelength line respectively, $Z_c$ being wave impedance of the half wavelength line and $\gamma$ being a propagation constant of the half wavelength line.

8. The non-transitory computer storage medium according to claim 5, wherein determining whether to perform the current differential protection on the differential point on the basis of the currents at the differential point and the adaptively changed braking coefficient and threshold value comprises:

forming following criterion for the current differential protection to determine whether to perform the current differential protection on the differential point on the basis of the currents at the differential point and the adaptively changed braking coefficient and threshold value:

$$\begin{cases} |I_{x-} + I_{x+}| \geq k|I_{x-} - I_{x+}| \\ |I_{x-} + I_{x+}| \geq I_{set} \end{cases}, \text{ and}$$

if such criterion for the current differential protection is met, performing the current differential protection.

* * * * *